(12) United States Patent
Bylund et al.

(10) Patent No.: US 10,724,530 B2
(45) Date of Patent: Jul. 28, 2020

(54) BLOWER WITH CRUISE CONTROL AND BOOST FUNCTION

(71) Applicant: HUSQVARNA AB, Huskvarna (SE)

(72) Inventors: Christian Bylund, Huskvarna (SE); Pär Martinsson, Jönköping (SE); Pierre Lanquist, Huskvarna (SE)

(73) Assignee: HUSQVARNA AB, Huskvarna (SE)

( * ) Notice: Subject to any disclaimer, the term of this patent is extended or adjusted under 35 U.S.C. 154(b) by 505 days.

(21) Appl. No.: 15/311,977

(22) PCT Filed: May 19, 2014

(86) PCT No.: PCT/EP2014/060193
§ 371 (c)(1),
(2) Date: Nov. 17, 2016

(87) PCT Pub. No.: WO2015/176735
PCT Pub. Date: Nov. 26, 2015

(65) Prior Publication Data
US 2017/0089349 A1  Mar. 30, 2017

(51) Int. Cl.
*F04D 27/00* (2006.01)
*H02P 29/00* (2016.01)
(Continued)

(52) U.S. Cl.
CPC ........... *F04D 27/004* (2013.01); *A01G 20/47* (2018.02); *F04D 25/06* (2013.01); *F04D 29/281* (2013.01);
(Continued)

(58) Field of Classification Search
CPC ...... H05K 5/023; H05K 5/0017; H02K 7/145; A01G 20/47; A47L 5/24; F04D 29/281; F04D 29/325; F04D 27/004
(Continued)

(56) References Cited

U.S. PATENT DOCUMENTS 4,644,606 A * 2/1987 Luerken ................. A01D 51/00
15/330
6,664,748 B2  12/2003 Kushida et al.
(Continued)

FOREIGN PATENT DOCUMENTS

AU  2005203154 A1  2/2006
AU  2014100150 A4  3/2014
(Continued)

OTHER PUBLICATIONS

International Search Report and Written Opinion for International Application No. PCT/EP2014/060193 dated Nov. 13, 2014.
(Continued)

*Primary Examiner* — Charles G Freay
*Assistant Examiner* — Lilya Pekarskaya
(74) *Attorney, Agent, or Firm* — Burr & Forman, LLP

(57) ABSTRACT

A blower may (100) include a power unit and fan assembly powered by the power unit, a stepless trigger (146), control circuitry configured to at least partially control application of power to drive the fan assembly based on a position of the stepless trigger (146), and one or more buttons. The fan assembly may rotate at a speed proportional to the position of the stepless trigger (146) in a first mode of operation. The control circuitry may be configured to enable the operator to actuate a first button (164) of the one or more buttons to shift to a second mode of operation in which speed of the fan assembly is not proportional to the position of the stepless trigger (146) over at least a portion of a range of motion of the stepless trigger (146).

11 Claims, 3 Drawing Sheets

(51) Int. Cl.
*A01G 20/47* (2018.01)
*F04D 25/06* (2006.01)
*F04D 29/28* (2006.01)
*F04D 29/32* (2006.01)
*H02K 7/14* (2006.01)
*H05K 5/00* (2006.01)
*H05K 5/02* (2006.01)

(52) U.S. Cl.
CPC ........... *F04D 29/325* (2013.01); *H02K 7/145* (2013.01); *H02P 29/00* (2013.01); *H05K 5/0017* (2013.01); *H05K 5/023* (2013.01); *F04D 25/0673* (2013.01)

(58) Field of Classification Search
USPC ............... 416/135, 139, 142, 179, 205, 500; 56/120, 13.3, 12.8, 12.9, 13.7; 15/405
See application file for complete search history.

(56) References Cited

U.S. PATENT DOCUMENTS

| | | | | |
|---|---|---|---|---|
| 7,476,091 | B2* | 1/2009 | Saitou | A47L 5/14 417/423.1 |
| 7,698,779 | B2 | 4/2010 | Schliemann et al. | |
| 8,742,703 | B2 | 6/2014 | Binder et al. | |
| 2006/0289186 | A1 | 12/2006 | Rabis et al. | |
| 2012/0076672 | A1* | 3/2012 | Binder | F04D 25/084 417/234 |
| 2014/0056738 | A1* | 2/2014 | Takahashi | F04D 13/068 417/411 |
| 2014/0140861 | A1 | 5/2014 | Pellenc | |
| 2014/0234130 | A1* | 8/2014 | Yamaoka | A47L 5/24 417/234 |
| 2015/0113760 | A1* | 4/2015 | Fukunaga | A47L 5/14 15/330 |

FOREIGN PATENT DOCUMENTS

| | | |
|---|---|---|
| CN | 1820901 A | 8/2006 |
| CN | 102606494 A | 7/2012 |
| CN | 203222756 U | 10/2013 |
| CN | 103534413 A | 1/2014 |
| EP | 1537814 A2 | 6/2005 |
| GB | 2416677 A | 2/2006 |
| JP | S5826598 A | 2/1983 |
| JP | 2007203100 A | 8/2007 |
| JP | 2009091719 A | 4/2009 |

OTHER PUBLICATIONS

International Preliminary Report on Patentability for International Application No. PCT/EP2014/060193 dated Nov. 22, 2016.

* cited by examiner

BLOWER WITH CRUISE CONTROL AND BOOST FUNCTION

TECHNICAL FIELD

Example embodiments generally relate to outdoor power equipment and, more particularly, relate to a cruise control and boost function for power equipment such as a blower.

BACKGROUND

Outdoor power equipment includes such devices as mowers, trimmers, edgers, chainsaws, blowers, and the like. Although powering such devices could be accomplished in any number of ways, these devices are often powered by a gas engine or electric motor. The engine or motor connects to the shaft of a tool, such as a cutting blade or fan assembly, which spins to perform useful work. The operator can precisely control the engine or motor speed by manipulating a stepless trigger, thereby selectively controlling the application of power to the engine or motor as needed.

During operation, the operator may frequently wish to fix the speed of the engine or motor. For example, when mowing a lawn of uniform grass length or blowing off a driveway, the operator may wish to bring the motor or engine up to the desired speed and then use cruise control to maintain that speed for consistent results. For this purpose, gas or petrol blowers typically employ a cruise control function that is mechanically implemented to maintain engine or motor speed above or around a desired level. In particular, such functions may hold engine speed at a fixed RPM by blocking the trigger control mechanically in a fixed position with a lever that the user can operate. On electric motors, buttons with various steps are defined so that a discrete speed change is associated with each step. Thus, a desired speed can be achieved by proceeding to the corresponding desired step.

To improve operational control of the blower, it may be desirable to provide control functions that can limit the rotational speed of the motor in an easy and intuitive way and also provide a speed boost when desired.

BRIEF SUMMARY OF SOME EXAMPLES

An example embodiment of a blower may include a power unit and fan assembly powered by the power unit, a stepless trigger, control circuitry configured to at least partially control application of power to drive the fan assembly based on a position of the stepless trigger, and one or more buttons. The fan assembly may rotate at a speed proportional to the position of the stepless trigger in a first mode of operation. The control circuitry may be configured to enable the operator to actuate a first button of the one or more buttons to shift to a second mode of operation in which speed of the fan assembly is not proportional to the position of the stepless trigger over at least a portion of a range of motion of the stepless trigger.

In another embodiment, a method of operating a blower may be provided. The method may include manipulating, during a first mode of operation, a stepless trigger to accelerate the blower motor to a desired rotational speed that is proportional to a position of the stepless trigger, and pressing a first button to shift to a second mode of operation in which an upper speed limit for the motor is set, but rotational speed remains proportional to the position of the stepless trigger below the upper speed limit. The method may further include pressing a second button to temporarily increase motor speed to a predefined maximum speed for a predefined period of time.

The boost button may be the same or different from the button used to activate the cruise control. The boost function can be activated independently of or in combination with the cruise control function. Additionally, the keypad may contain light-emitting diode (LED) indicators that illuminate to indicate the status of each keypad function.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1:
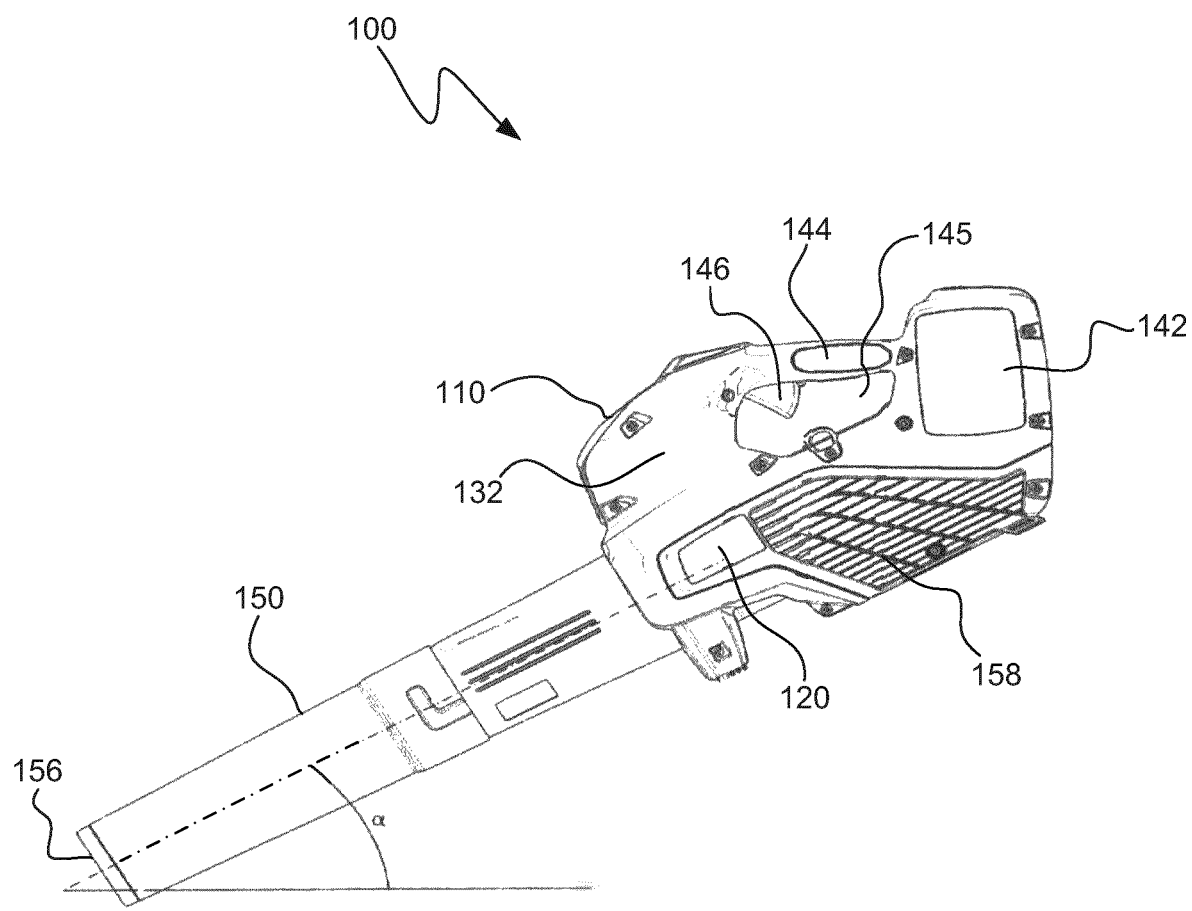
FIG. 1 illustrates a side view of a blower in accordance with an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true. As used herein, operable coupling should be understood to relate to direct or indirect connection that, in either case, enables functional interconnection of components that are operably coupled to each other.

In some cases, an operator of a blower may wish to use a cruise control function to set a limit on motor speed in order to avoid blowing up too much dust in the air, to save power, or to achieve the peak operating efficiency of the engine or motor. In addition, an operator that encounters thick weeds while mowing or wet or sticky substances while blowing might want to temporarily increase the engine or motor speed to power through these difficult areas. Accordingly, it may be desirable to have a temporary increase in engine or motor speed that is easy to implement but also prevents prolonged operation at increased speed that could overload the blower or empty the battery too fast.

FIG. 1 illustrates a side view of a blower 100 in accordance with an example embodiment. It should be appreciated that the blower 100 merely represents one example of power equipment on which an example embodiment may be employed. Referring to FIG. 1, the blower 100 may include a housing 110 inside which various components of the blower 100 are housed. The blower 100 may further include a motor, engine, or power unit for providing the driving force to move air through the blower 100. In some embodiments, the power unit may be a three phase electric motor that is operated under the control of a control unit or control circuitry and powered by a battery or battery adaptor. However, a DC motor could be used in some embodiments as well, as could a gas engine or another power unit. In this embodiment, the motor is housed in the motor housing portion 120, which is adjacent to the blower tube 150.

The housing 110 may be formed of plastic, composite materials, metals, or any other desirable materials of sufficient rigidity. In an example embodiment, the housing 110 may be formed of two or more molded pieces that can be fit together. In some cases, the molded pieces may form half-shells (e.g., right and left half-shells) that can be affixed to each other via welding, adhesives, snap fittings, fixing members (e.g., screws), and/or the like. When molded pieces are fit together, they may form a seam at the location of joining between the molded pieces.

In some embodiments, the control unit or control circuitry may be housed in its own portion of the housing 110. The portion of the housing 110 in which the control unit is housed may be referred to as a control unit housing portion 132, and the control unit housing portion 132 may be an integral part of a half-shell (as described above) or may be a separate housing portion that is joined to other housing portions. As shown in FIG. 1, the control unit housing portion 132 may be disposed at a forward portion of the housing 110.

In an example embodiment, the battery may be housed in a battery compartment 142 that may be disposed at a rear portion of the housing 110, separated from the control unit housing portion 132 by a handle 144. The handle 144 may be formed by extending between a distal end of the control unit housing portion 132 to a top portion of the battery compartment 142. Thus, the handle 144 may extend above the motor housing portion 120. In some embodiments, an aperture or gap may be formed in the housing 110 by the handle 144 to enable the operator's hand to extend around the handle 144. The aperture may be referred to as a handle aperture 145.

The handle 144 may include a stepless trigger 146 that may be operated by a finger of the operator while the operator holds the handle 144. Actuation of the stepless trigger 146 may cause power from the battery to be selectively applied to the motor to turn the motor based on control provided by the control unit. In some cases, the control unit may include interlocks, protective functions, or other control mechanisms that may sense various conditions of the blower 100 via sensors, switches, or other mechanisms in order to selectively control the application of power to the motor based on indications of user intent (e.g., via actuation of the stepless trigger 146) and/or determinations regarding the state of the blower 100 as provided by the sensors, switches, or other mechanisms. As can be seen from FIGS. 1 and 2, the stepless trigger 146 extends downward from the handle 144 into the handle aperture 145.

It should be appreciated that although FIG. 1 shows an example in which the stepless trigger 146 is used for selective powering of the motor, other example embodiments may employ a selector, switch, button, or other such operative member in order to selectively control operation of the motor. Thus, for example, on/off, speed control, or other operable functions for controlling the motor may be performed using an operative member of any desirable form, and the stepless trigger 146 is just one example.

The blower 100 may further include a blower tube 150 that is attached to housing 110 (or is a part of the housing 110) and through which air may be expelled. The blower tube 150 may include an inlet portion and an outlet 156. The outlet 156 may be at a distal end of the blower tube 150 and the inlet portion may be at an opposite end of the blower tube 150 proximate to the motor and the battery. In an example embodiment, the inlet portion may be disposed proximate to an aperture array 158 including louvers, vanes, guide holes, or other such apertures formed in the housing 110 to enable air to enter into the blower tube 150 responsive to operation of the motor to be expelled via the outlet 156. In this regard, the operation of the motor may cause an impeller or fan assembly to rotate so that a low pressure area is generated to draw air into the inlet portion through the aperture array 158 to be passed through the fan assembly and expelled from the blower tube 150 at the outlet 156 to blow leaves, debris, or any other material. In some cases, the louvers, vanes, guide holes, or other such apertures formed in the housing 110 to embody the aperture array 158 may be strategically located to reduce the ability of noise from the motor or airflow in the blower tube 150 from transmitting up to the operator's ears. Moreover, the louvers, vanes, guide holes, or other such apertures of the aperture array 158 may be formed on each respective side portion of the housing 110 as shown in FIG. 1.

An example embodiment of a blower 100 may therefore include a housing 110 that encloses the internal components, such as a motor, fan assembly, control circuitry, and battery. The housing 110 can define a handle portion 144 with handle aperture 145, and the fan assembly may be operably coupled to the blower tube 150 to force air through the blower tube 150 responsive to operation of a motor. As the operator compresses the stepless trigger 146, the motor speed may increase in proportion to the amount of compression. Thus, the operator may increase speed by more fully compressing the stepless trigger 146. Then, when a desired motor speed and corresponding airflow level through the blower is achieved, the operator may select to implement a cruise control function using a keypad in accordance with an example embodiment.

Figure 2:
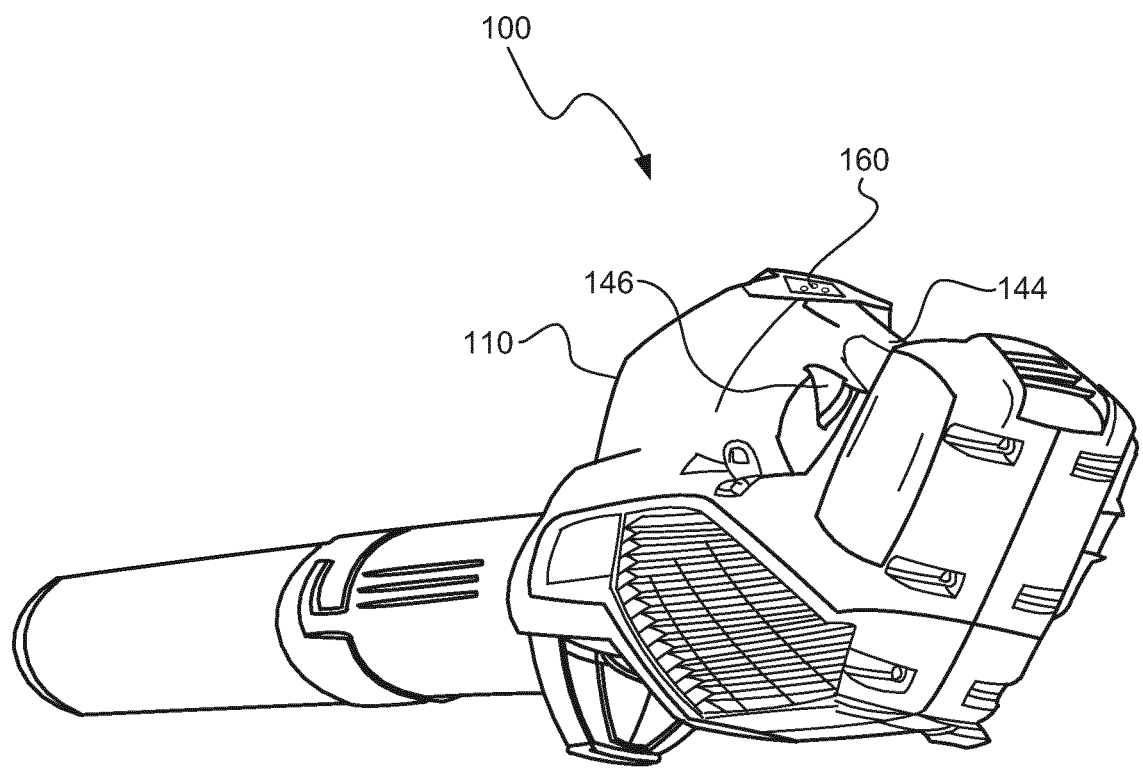
FIG. 2 illustrates a perspective side view of the blower to show a control panel in accordance with an example embodiment.
Figures 3, 4:
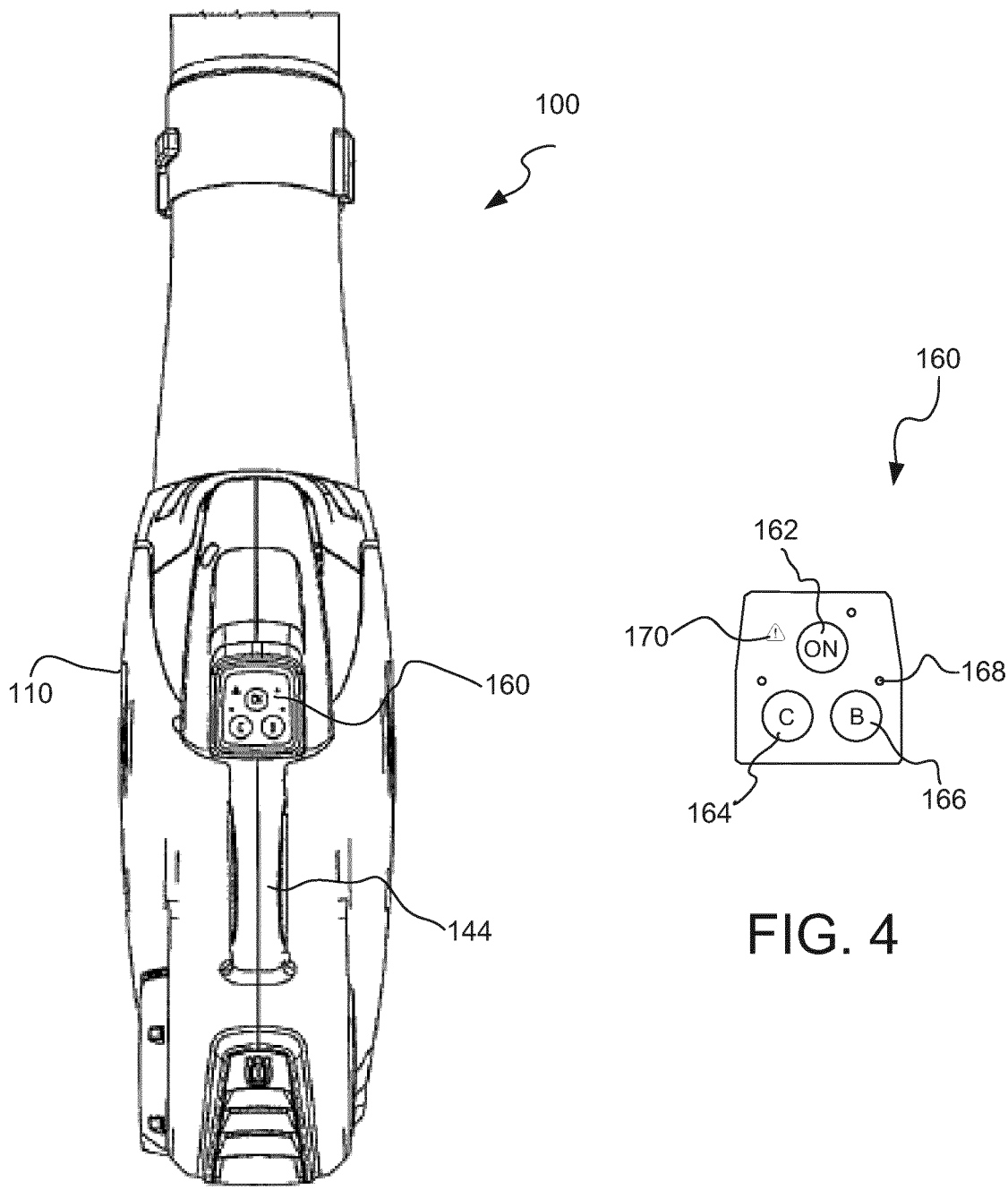
FIG. 3 illustrates a top view of the blower to show a control panel in accordance with an example embodiment.
FIG. 4 illustrates a control panel in accordance with an example embodiment.

As shown in FIGS. 2 and 3, an exemplary embodiment may have a control keypad 160 located on top of the blower housing 110 toward the forward end of the handle 144. The keypad 160, which is described in more detail below, provides for easy operation or control of the blower either in conjunction with, or independently of, the stepless trigger 146. The keypad 160 may contain one or more buttons (162, 164, and 166) that may be manipulated easily by the operator. Of note, the keypad 160 may interface with processing circuitry that may include a processor and memory, where various instructions, applications and/or the like are stored in the memory and executed by the processor. Various functions described herein may therefore be implemented by operation of the processing circuitry to direct or cause the corresponding functionality to be performed responsive to execution of stored instructions for performing (when executed) the same.

FIG. 4 shows an exemplary embodiment of the keypad 160, which contains three buttons for controlling the blower. The "ON" button 162, or power button, starts and stops the blower; the "C" button 164 (i.e., a first button) activates the cruise control function; and the "B" button 166 (i.e., a second button) activates the boost function. The keypad also has one or more indicators 168, which are preferably light-emitting diodes (LEDs) that illuminate when the blower is on or when the function associated with the indicator is activated, thereby showing the operator the operational status of the blower.

In operation, the operator reaches the required airflow for a certain task by manipulating the stepless trigger 146. When a sufficient airflow is achieved the operator can press the cruise control button 164 which sets the maximum speed for the motor relevant to the blower airflow. When the cruise control is activated, the associated LED indicator 168 is illuminated and the speed limit is set in memory until the cruise control is deactivated and the stepless trigger 146 is released. The cruise control function prevents the motor speed from exceeding this maximum speed limit no matter how far the stepless trigger 146 is pressed. Thus, for example, the operator could simply completely compress the stepless trigger 146 and not have to worry about trying to maintain a certain level of tension or compression. However, lower motor speeds are still possible by relaxing the compression level below the maximum speed limit setpoint. The operator can deactivate the cruise control and regain normal trigger-control of the blower by simply pressing the cruise control button 164 again. Turning the blower off (e.g., by pressing the power button 162) or removing the battery also resets the cruise control function and the speed limit.

A boost function may also be activated by the keypad 160. In the exemplary embodiment, the boost function is controlled by a separate button (e.g., B button 166). However, the boost function could be alternatively activated using the same button as the cruise control, for example, by holding the button down for a different amount of time as compared to the cruise control function, or by providing a specific pattern of actuation (e.g., a double press, etc.). The boost function may be activated when the stepless trigger 146 is pressed at least some prescribed amount, for example, 10% of the full trigger position, or when the cruise control is activated. When the boost function is activated, the motor spins up to a maximum (or predeteermined) speed for a predefined time (e.g., five seconds) giving the user an increased airflow and airspeed (i.e., power). This boost function could be used, for example, to remove sticky or wet objects from a surface. To save battery time and prevent overheating of components, the use of this function may be limited over time, for example, such that the five-second boost is only available once every thirty seconds.

The boost function can be used in combination with, or independently of, the cruise control function. The cruise control is a very convenient solution when it is desirable to save power or to limit the total airflow to prevent blowing up too much dust in the air. By using the boost function, it is possible to have a high airflow for a short time to, for example, remove things that are stuck to the ground without overloading the blower or emptying the battery too fast.

It should be appreciated that although the keypad 160 is located on top of the handle in the exemplary embodiments discussed above, it could instead be located anywhere on the blower housing 110 that provides for easy user input and function selection. For example, the keypad 160 may be located on the underside or side of the handle 144, in the handle aperture 145 or on the stepless trigger 146 itself. Furthermore, the control buttons need not be confined to a single keypad or panel at all, but may instead be placed as individual buttons on the blower housing 110. However, by locating the keypad 160 on the forward end of the handle 144 and placing all buttons (162, 164, and 166) on the keypad 160 along with their respective LED indicators 168, operators can conveniently manipulate the keypad buttons without otherwise adjusting their grip and the LED indicators 168 remain readily visible during operation.

Accordingly, a blower of an example embodiment may include a power unit and fan assembly powered by the power unit, a stepless trigger, control circuitry configured to at least partially control application of power to drive the fan assembly based on a position of the stepless trigger, and one or more buttons (e.g., on a keypad). The fan assembly may rotate at a speed proportional to the position of the stepless trigger in a first mode of operation. The control circuitry may be configured to enable the operator to actuate a first button among the one or more buttons (e.g., on the keypad) to shift to a second mode of operation in which speed of the fan assembly is not proportional to the position of the stepless trigger over at least a portion of a range of motion of the stepless trigger.

In some cases, the features above may be modified, augmented or amplified in various optional ways. For example, in some cases, the second mode may be entered by activating a cruise control function responsive to actuating a cruise control button on the keypad, thereby setting an upper speed limit for the fan assembly that is equal to a speed of the fan assembly when the cruise control function was activated. In some embodiments, the operator may be enabled to deactivate the cruise control function by pressing the cruise control button again. In an example embodiment, the operator may be enabled to activate a boost function by pressing a button on the keypad, thereby causing the fan assembly to accelerate to a maximum speed. In some cases, the boost function may be limited to enable activation only once in a predefined time interval. In some embodiments, the boost function may be limited to enable activation for a predefined duration of time. In some examples, the predefined duration of time is about five seconds and the predefined time interval is about thirty seconds. In an example embodiment, the button may be the first button or it may be a different button. When the button is the first button, a single actuation of the first button may shift the device to the second mode of operation (i.e., the cruise control function), and a double actuation of the first button may cause the device to shift to a third mode of operation (i.e., the boost function). In some embodiments, the boost function is enabled to be activated only after the stepless trigger has been pressed a predefined amount (e.g., at least about 10%). In some cases, the boost function is enabled to be activated independent of the cruise control function, but in others it is enabled to be activated responsive to prior activation of the cruise control function. In an example embodiment, light-emitting diode (LED) indicators located on the keypad may indicate a mode of operation of the blower.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not That which is claimed:

1. A blower comprising:
a power unit configured to provide a driving force to move air through the blower;
a fan assembly powered by the power unit;
a stepless trigger;
a control circuitry configured to at least partially control application of power to drive the fan assembly based on a position of the stepless trigger; and
one or more buttons,
wherein the blower is configured to operate in a first mode of operation and a second mode of operation,
wherein in the first mode of operation, the fan assembly is configured to rotate at a speed proportional to the position of the stepless trigger,
wherein in response to actuation of a first button of the one or more buttons by an operator of the blower, the control circuitry is configured to shift the blower to the second mode of operation in which the speed of the fan assembly will not exceed a maximum speed limit, and
wherein in response to the stepless trigger being compressed past a predefined position by activating a cruise control function in the second mode of operation, the speed of the fan is limited to the maximum speed limit, and
wherein in response to the stepless trigger being compressed less than the predefined position in the second mode of operation, the speed of the fan assembly is lower than the maximum speed limit and proportional to the position of the stepless trigger.

2. The blower of claim 1, wherein in response to the operator pressing the first button again, the blower is configured to return to the first mode of operation.

3. The blower of claim 1, wherein in response to an actuation of a second button of the one or more buttons by the operator of the blower, a boost function of the blower is controlled by the second button and is activated thereby causing the fan assembly to accelerate to a maximum speed.

4. The blower of claim 3, wherein the actuation of the boost function is limited to only once in a predefined time interval.

5. The blower of claim 4, wherein the actuation of the boost function is limited for a predefined duration of time.

6. The blower of claim 5, wherein the predefined duration of time is about five seconds and the predefined time interval is about thirty seconds.

7. The blower of claim 3, wherein the first button and the second button are provided on a keypad.

8. The blower of claim 7, wherein the keypad is provided proximate to a handle of the blower.

9. The blower of claim 3, wherein the boost function is activated only after the stepless trigger has been pressed a predefined amount.

10. The blower of claim 9, wherein the predefined amount is about 10% of a full trigger position of the stepless trigger.

11. The blower of claim 1, wherein light-emitting diode (LED) indicators located on the keypad indicate a mode of operation of the blower.

* * * * *